United States Patent
Nield et al.

(10) Patent No.: US 6,775,315 B1
(45) Date of Patent: Aug. 10, 2004

(54) APPARATUS AND METHOD OF DIRECTING A LASER BEAM TO A THERMALLY MANAGED BEAM DUMP IN A LASER SYSTEM

(76) Inventors: Scott Allen Nield, E. Benson St., Reading, OH (US) 45215; Robert M. Trusty, 12126 Coyote Ct., Cincinnati, OH (US) 45241; William Conrad Stenton, 1195 Sundowner Rd., Midland, Ontario (CA), L4R 4K4; A. James Gabura, 1-572 William Street, Midland, Ontario (CA), L4R 4Z7; Edward Malcolm Benneyworth, 462 Parkview Court, Midland, Ontario (CA), L4R 5G3

( * ) Notice: Subject to any disclaimer, the term of this patent is extended or adjusted under 35 U.S.C. 154(b) by 0 days.

(21) Appl. No.: 09/877,283

(22) Filed: Jun. 8, 2001

(51) Int. Cl.[7] .............................. A61B 18/22; H01S 3/00
(52) U.S. Cl. ........................... 372/109; 372/14; 372/15; 359/223; 606/11; 606/12
(58) Field of Search .......................... 372/14, 15, 109, 372/29.02, 29.022, 16, 107, 9; 359/223, 224, 614; 606/11, 12, 10; 219/121.61, 121.69, 121.78, 121.79, 121.82

(56) References Cited

U.S. PATENT DOCUMENTS

| | | | |
|---|---|---|---|
| 4,583,539 A | | 4/1986 | Karlin et al. |
| 4,663,520 A | | 5/1987 | Tanaka et al. |
| 4,799,767 A | | 1/1989 | Woodruff |
| 4,864,098 A | | 9/1989 | Basanese et al. |
| 4,911,711 A | * | 3/1990 | Telfair et al. ................... 606/5 |
| 4,946,256 A | | 8/1990 | Woodruff |
| 4,994,059 A | | 2/1991 | Kosa et al. |
| 5,032,005 A | | 7/1991 | Woodruff |
| 5,124,993 A | * | 6/1992 | Braunlich et al. ............ 372/31 |
| 5,153,607 A | | 10/1992 | Ichinokawa |
| 5,323,269 A | | 6/1994 | Walker et al. |
| 5,364,391 A | | 11/1994 | Konwitz |
| 5,596,590 A | | 1/1997 | de Ruyter et al. |
| 5,798,518 A | | 8/1998 | Coleman et al. |
| 5,891,394 A | * | 4/1999 | Drocourt et al. .............. 372/14 |
| 6,021,151 A | * | 2/2000 | Eguchi et al. ................. 422/50 |
| 6,537,269 B1 | * | 3/2003 | Abe ............................. 606/12 |
| 6,575,962 B2 | * | 6/2003 | Hohla ........................... 606/5 |
| 2002/0136247 A1 | * | 9/2002 | Ikeda et al. ................... 422/50 |

FOREIGN PATENT DOCUMENTS

| | | |
|---|---|---|
| JP | H9-122963 | 5/1997 |
| RU | SU 1267341 A1 | 10/1986 |

* cited by examiner

*Primary Examiner*—Jerome Jackson
*Assistant Examiner*—Matthew C Landau

(57) ABSTRACT

An optical bench for processing laser light in a laser system, including an optical bench housing, a beam dump mounted to the optical bench housing so as to be in optical communication therewith, steering optics mounted within the optical bench housing for directing the laser light in a path from a laser light input to an output, and a mechanism for causing the laser light to deviate from the path and be directed into the beam dump upon recognition of a specified condition in the laser system, wherein the laser light is thermally isolated from the steering optics. The mechanism can either cause at least one optically reflective element to be inserted into the path, cause at least one optical element of the steering optics to have a change in position with respect to the path, and/or causes at least one optical element of the steering optics to be removed from the path.

11 Claims, 5 Drawing Sheets

US 6,775,315 B1

APPARATUS AND METHOD OF DIRECTING A LASER BEAM TO A THERMALLY MANAGED BEAM DUMP IN A LASER SYSTEM

BACKGROUND OF THE INVENTION

The present invention relates to an optical bench for a laser system and, more particularly, to a laser system having an optical bench with steering optics to direct a laser beam to a thermally managed beam dump upon recognition of certain conditions.

It is well known that energy generators in the form of laser systems have been utilized to treat many disease states through surgical procedures. Such laser systems typically have a safety mechanism included therein to block emission of the laser beam in case an emergency situation or other anomaly occurs. One exemplary safety mechanism for performing this function involves a metal plate which is movable into the laser light path when the laser system detects an abnormal condition. While this mechanism is able to perform its intended safety function by effectively blocking the laser light, the metal plate is unable to absorb the light energy from the laser without a corresponding temperature increase within the optical bench of the laser system. This has had the adverse effect of causing thermal damage to the optics of the laser system. The laser light may also discharge particles and debris from the metal plate, which can scatter over the optical elements and cause physical damage thereto. Accordingly, the optics of a laser system will typically need to be refurbished or replaced when such a safety device has been activated.

In light of the foregoing concerns, as well as the continued need for safety mechanisms in laser treatment systems, it would be advantageous to have a safety mechanism that does not cause damage to the laser optics when activated. An optical bench of a laser treatment system with such a safety mechanism would therefore have the ability to manage the thermal energy dissipated from the laser beam and keep damaging energy and damaging particles away from the optics. It would also be desirable in this regard for the laser treatment system to include a beam dump which is thermally separated from the optics.

BRIEF SUMMARY OF THE INVENTION

In accordance with a first aspect of the present invention, an optical bench for processing laser light in a laser system is disclosed as including an optical bench housing, a beam dump mounted to the optical bench housing so as to be in optical communication therewith, steering optics mounted within the optical bench housing for directing the laser light in a path from a laser light input to an output, and a mechanism for causing the laser light to deviate from the path and be directed into the beam dump upon recognition of a specified condition in the laser system, wherein the laser light is thermally isolated from the steering optics. The mechanism can either cause at least one optically reflective element to be inserted into the path, cause at least one optical element of the steering optics to have a change in position with respect to the path, and/or cause at least one optical element of the steering optics to be removed from the path.

In accordance with a second aspect of the present invention, a laser system is disclosed as including a laser for providing laser light, a first optical fiber in optical communication with the laser light, a second optical fiber, and an optical bench for directing the laser light from the first optical fiber to the second optical fiber. The optical bench further includes an optical bench housing, a beam dump mounted to the optical bench housing so as to be in optical communication therewith, steering optics mounted within the optical bench housing for directing the laser light in a path from the laser to the second optical fiber, and a mechanism for causing the laser light to deviate from the path and be directed into the beam dump upon recognition of a specified condition in the laser system, wherein the laser light is thermally isolated from said steering optics. A processor is also provided for controlling the mechanism. The mechanism can either cause at least one optically reflective element to be inserted into the path, cause at least one optical element of the steering optics to have a change in position with respect to the path, and/or cause at least one optical element of the steering optics to be removed from the path.

In accordance with a third aspect of the present invention, a method of preventing laser light from being directed in a path through an optical bench into optical communication with an optical fiber is disclosed as including the steps of sensing a specified condition in the laser system, causing the laser light to deviate from the path into a beam dump upon recognition of the specified condition, and thermally isolating the laser light from the optical bench.

BRIEF DESCRIPTION OF THE DRAWINGS

While the specification concludes with claims particularly pointing out and distinctly claiming the present invention, it is believed that the same will be better understood from the following description taken in conjunction with the accompanying drawings in which:

DETAILED DESCRIPTION OF THE INVENTION

Figure 1:
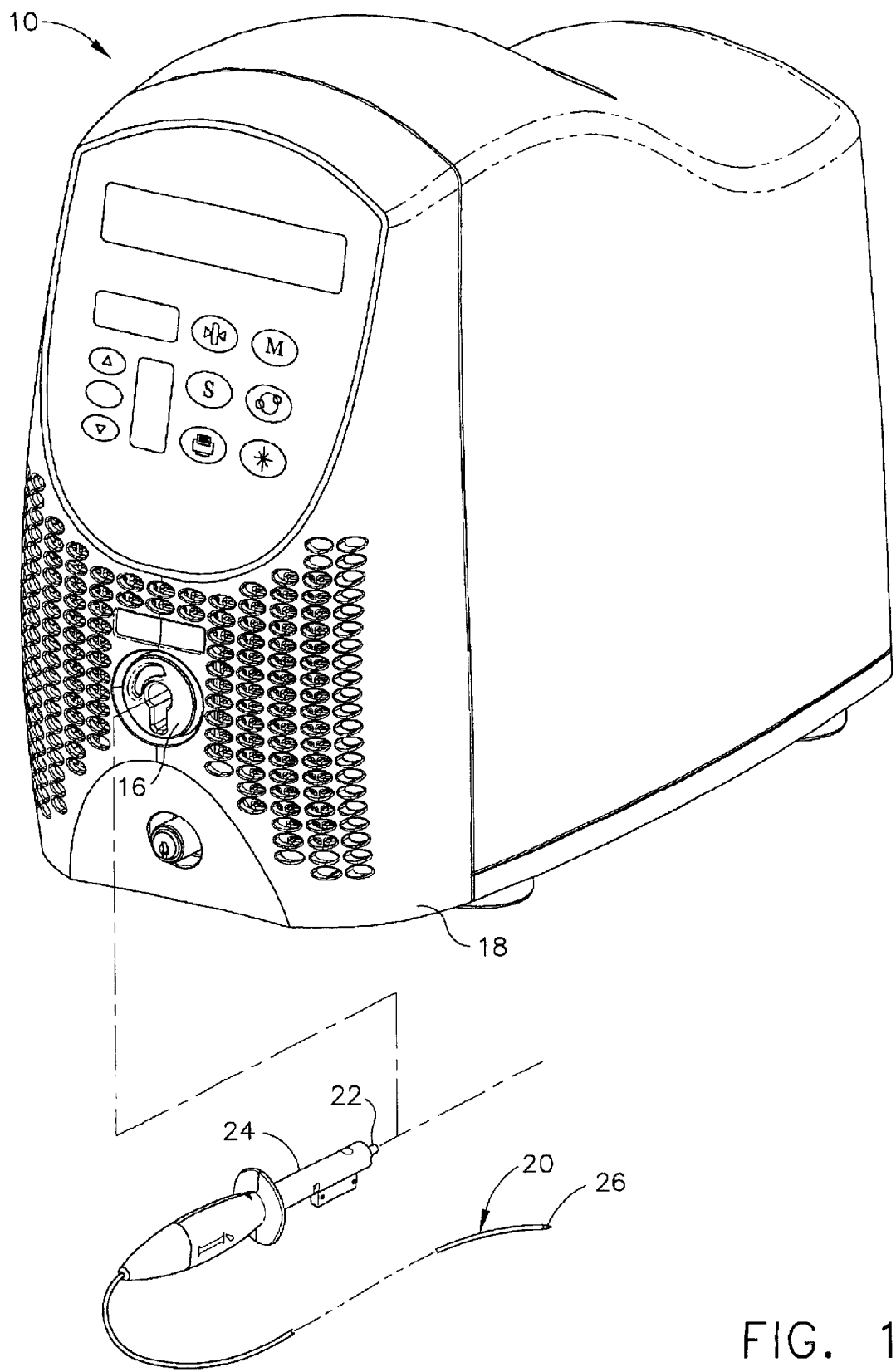
FIG 1 is an isometric view of a laser treatment system in accordance with the present invention having an optical fiber connectable thereto.

Referring now to the drawings in detail, wherein identical numerals indicate the same elements throughout the figures, FIG. 1 depicts a laser treatment system 10 for transferring energy to human tissue by means of light from an optical fiber 20. A first laser diode is provided in laser treatment system 10 to produce a first laser beam having a predetermined power (preferably in a range of approximately 2–20 watts) and a predetermined wavelength (preferably in a range of approximately 800–850 nanometers) useful for the medical treatment of disease. As further seen in FIG. 1, a connect block 16 is located within a front portion of a housing 18 for laser treatment system 10. Connect block 16 assists first laser beam 14 in being optically linked with a first end 22 of optical fiber 20 via a connector 24 so that first laser beam 14 can be transmitted from a second end (or tip) 26 of optical fiber 20.

Figure 2:
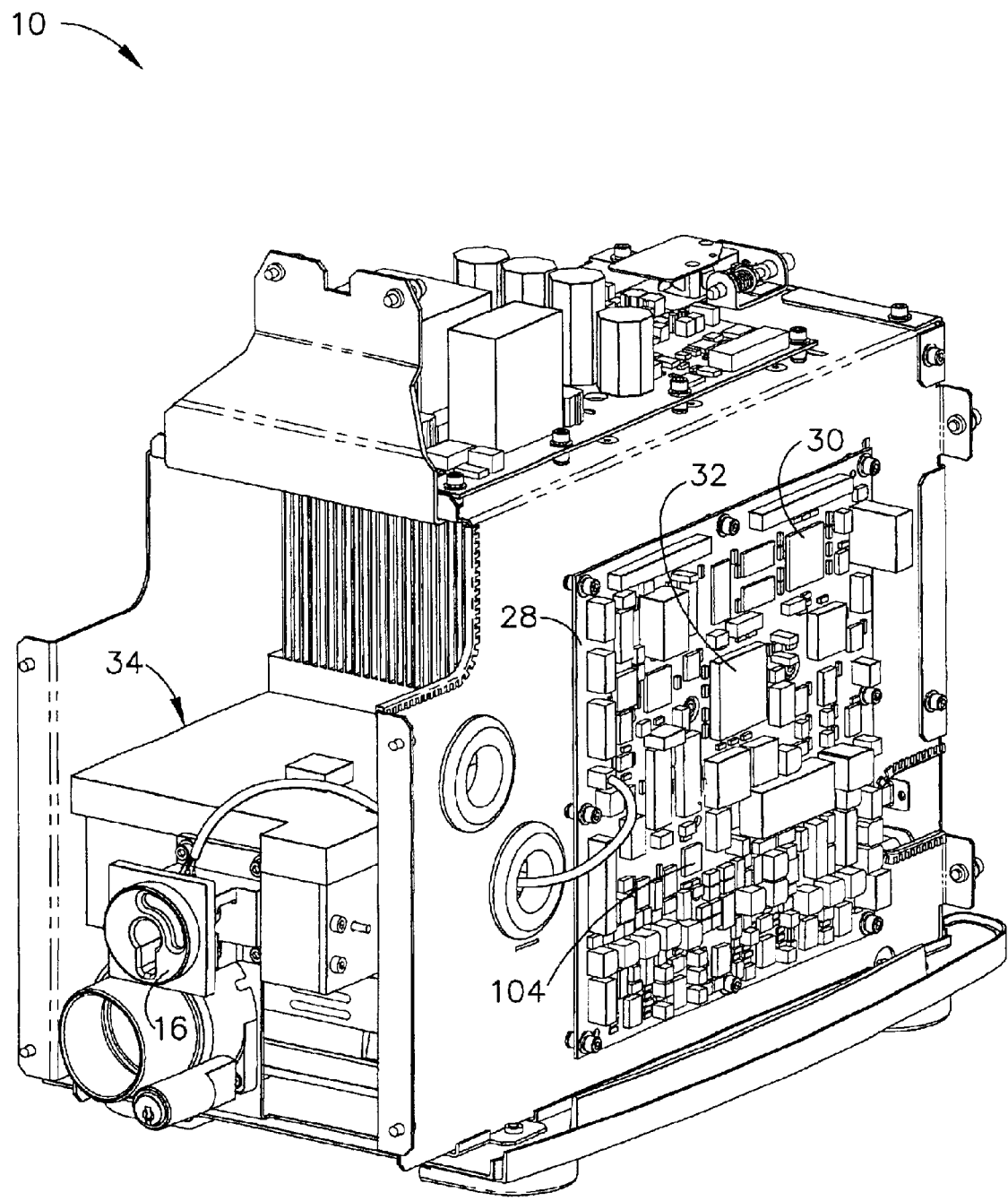
FIG. 2 is an isometric view of the laser treatment system of FIG. 1, where the housing has been removed so as to enable viewing of a controller board and the exterior of an optical bench therein.

FIG. 2 depicts laser treatment system 10 with housing 18 removed so as to expose an optical bench, identified generally by reference numeral 34, in order to direct first laser beam 14 into optical communication with optical fiber first end 22 during normal operation. A controller board 28 is also shown that includes, among other components, a main processor 30 for receiving and processing electronic signals to control the operation of laser treatment system 10. As explained in greater detail herein, main processor 30 provides energy to certain optical components within optical bench 34 when laser treatment system 10 is operational. In this way, main processor 30 is able to prevent first laser beam 14 from entering optical fiber 20 upon recognition of an anomalous condition by removing energy from such optical components. It will also be appreciated that the optical components of optical bench 34 will preferably prevent first laser beam 14 from entering optical fiber 20 when laser system 10 is not operational (i.e., not lasing) as a failsafe feature. While other anomalous conditions will be identified herein, it will be understood that main processor 30 will deactivate such optical components when laser treatment system 10 detects unwanted conditions such as high tissue temperature, charring of the tissue, or an overstressed or broken fiber.

Figure 3:
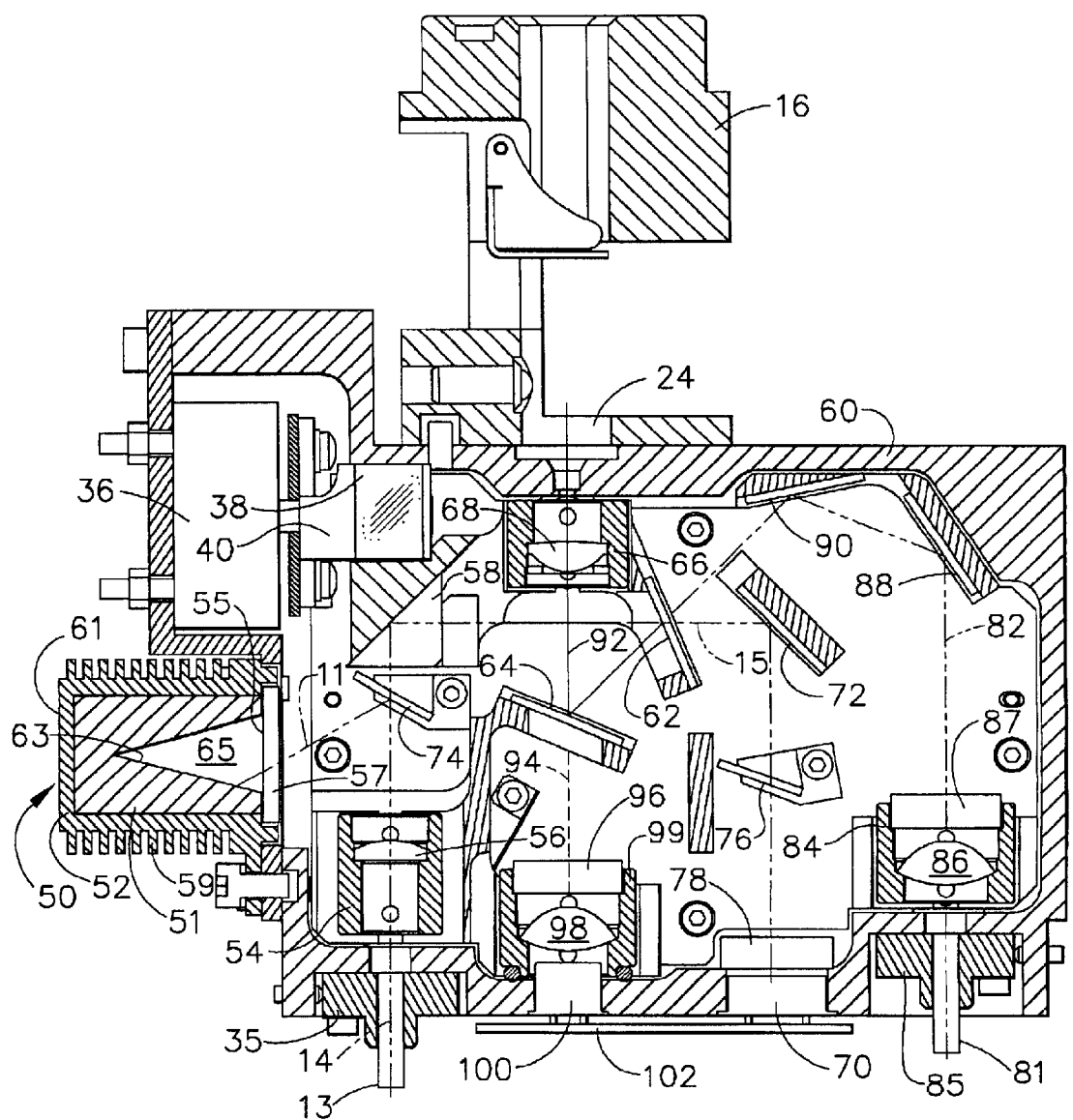
FIG. 3 is a section view of the optical bench depicted in FIG. 2, where the steering optics therein are in a normal operating position so as to allow a laser beam used for medical treatment procedures to pass through the optical bench and into the optical fiber.
Figure 4:
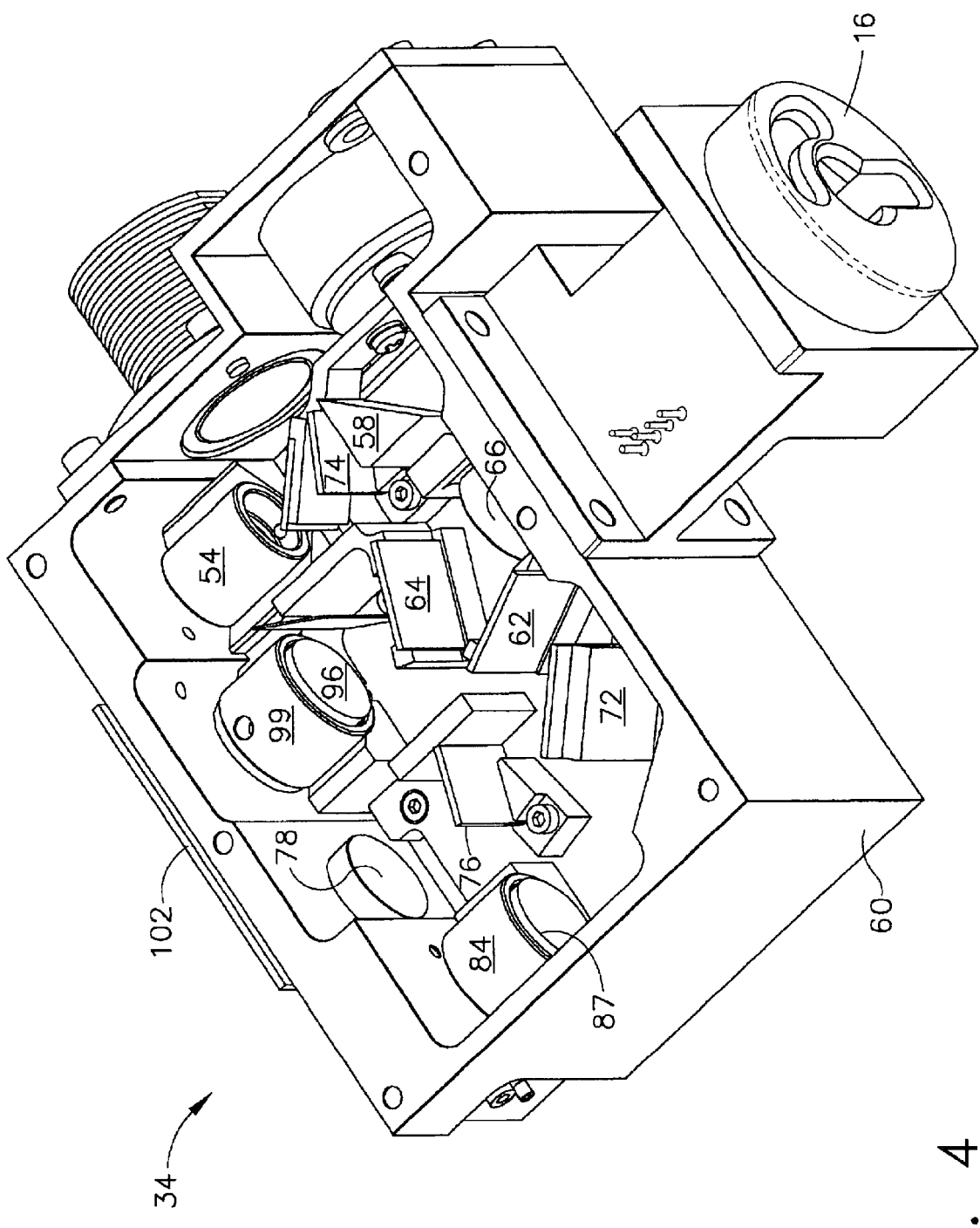
FIG. 4 is an isometric view of the optical bench depicted in FIGS. 2 and 3, where a connect block and a sensor board are shown as being attached thereto.

With regard to the operation of optical bench 34, it will be seen from FIGS. 3 and 4 that the path of first laser beam 14 preferably enters optical bench 34 via an optical fiber 13 in optical communication with the first laser diode. Optical fiber 13 is positioned within a connector 35 in optical bench 34 to assure proper alignment. First laser beam 14 is transmitted through a beam collimator 54 containing a lens 56 and is preferably directed toward a total internal reflection (TIR) prism 58 mounted to a housing 60 for optical bench 34. First laser beam 14 preferably reflects off TIR prism 58 and is received by a first beamsplitter 62, which reflects first laser beam 14 toward a second beamsplitter 64. First laser beam 14 is then reflected from second beamsplitter 64 through an output beam lens assembly 66 and an output lens 68 so as to place first laser beam 14 in optical communication with optical fiber first end 22 via connector 24. It will be appreciated that a small percentage of first laser beam 14 (identified by reference numeral 15) is preferably transmitted by first beamsplitter 62 to a laser power detector 70 by means of a turning mirror 72 so that the power output of first laser beam 14 can be monitored. Further explanation of first beamsplitter 62, laser power detector 70, and laser beam 15 is provided in a related patent application filed concurrently herewith entitled "Apparatus And Method Of Monitoring And Controlling Power Output Of A Laser System," having Ser. No. 09/877,275 which is owned by the assignee of the present invention and hereby incorporated by reference. Of course, various filters may be employed to better isolate and attenuate the wavelength of light provided by first laser beam 14, as exemplified by filter 74, correction filter 76, and neutral density filter 78.

Similarly, a second laser diode preferably provides a second laser beam 82, also known herein as a marker laser beam, to optical bench 34 by means of an optical fiber 81. Optical fiber 81 is positioned within a connector 85 in optical bench 34 to assure proper alignment. Second laser beam 82 is transmitted through a marker beam collimator 84, a marker lens 86, and a marker filter 87 attached to optical bench housing 60. Marker laser beam 82 preferably has a predetermined power (preferably in a range of approximately 0.5–2 milliwatts) and a predetermined wavelength (preferably in a range of approximately 600–650 nanometers). It will be appreciated that marker laser beam 82 is preferably used as the light source to optically stimulate a fluorescent slug in optical fiber 20 so as to generate a desired optical fluorescent response therefrom. In order to place marker laser beam 82 in optical communication with optical fiber first end 22 via connector 24, it is directed toward a first laser turning mirror 88 which reflects it to a second laser turning mirror 90. Marker laser beam 82 then impacts first beamsplitter 62, which transmits most of marker laser beam 82 (as a function of its wavelength) so that it passes therethrough to second beamsplitter 64. Marker laser beam 82 then reflects off second beamsplitter 64 and through output beam lens assembly 66 and output lens 68. Accordingly, both first (treatment) laser beam 14 and second (marker) laser beam 82 are routed from first beamsplitter 62 to second beamsplitter 64, as indicated by reference numeral 92, into first end 22 of optical fiber 20 during normal operation of laser treatment system 10.

It will be appreciated that marker laser beam 82 provides an optical stimulus to the fluorescent slug in optical fiber second end 26, which absorbs the energy of marker laser beam 82 and fluoresces in response thereto. The time delay from stimulation of the fluorescent slug by marker laser beam 82 to the fluorescence of such fluorescent slug is a function of the temperature of optical fiber second end 26 and can be measured and used to calculate such temperature. The optical fluorescent response, indicated by reference numeral 94, is transmitted back through optical fiber 20 and out optical fiber first end 22 into optical bench 34. Optical fluorescent response 94 preferably has extremely low power (in a range of approximately 5–100 nanowatts) and has a preferred wavelength of approximately 680–780 nanometers. Optical fluorescent response 94 then passes through output lens 68 and output beam lens assembly 66 to second beamsplitter 64. Second beamsplitter 64 is constructed so that optical fluorescent response 94 is transmitted therethrough to a signal filter set 96, which functions to block any reflected marker and treatment light. The remaining signal, filtered to pass only the fluorescent and blackbody wavelengths, passes through a focussing lens 98 held together with the signal filter set 96 in a signal optical assembly 99 onto a fluorescence/blackbody detector 100. It will be understood that the blackbody radiation returns along the same path as optical fluorescent signal 94, but is passed in a fourth waveband through second beamsplitter 64. Florescence/blackbody detector 100 thus captures and analyzes this signal as a secondary temperature mechanism for a fail-safe mode, where blackbody radiation indicating a temperature too high for proper operation will shut down power to the first laser diode.

It will be seen that a sensor board 102 is provided adjacent to optical bench housing 60 so as to interface with fluorescence/blackbody detector 100 and laser power detector 70. Circuitry on sensor board 102 is connected to and communicates with controller board 28 in order to calculate the temperature of optical fiber second end 26. Optical bench housing 60 also serves to cover optical bench 34 and keep stray light out. In the present embodiment of the invention, black anodized 6061-T6 aluminum is utilized for optical bench housing 60 to minimize reflection and scattering of ambient light. It will be appreciated, however, that optical bench housing 60 can be created from a reflective material coated by an absorptive material, as it is not purposely placed in a direct path with first laser beam 14.

In a preferred embodiment, a solenoid 36 is attached to optical bench housing 60 and holds a mirror 38 at the end of a shutter arm 40. It will be seen that solenoid 36 is able to actuate shutter arm 40 to move mirror 38 into and out of the path of first laser beam 14 after being passed by beam collimator 54. FIG. 3 depicts mirror 38 as being positioned outside the path of first laser beam 14 during normal operation of laser treatment system 10, thereby allowing laser light to pass into the rest of optical bench 34. While shutter arm 40 is shown as having been rotated approximately 90° from the position shown in FIG. 5, it will be appreciated that solenoid 36 need rotate shutter arm 40 only an amount necessary to move mirror 38 out of the path of first laser beam 14. A position detection mechanism, identified generally by reference numeral 42 (see FIG. 5), is provided to continually monitor the position of shutter arm 40. More specifically, position detection system 42 preferably includes a pair of Hall-effect sensors 44 located near a magnet 46 placed on shutter arm 40. It will be appreciated that Hall-effect sensors 44 sense the position of mirror 38 and communicate the position thereof to main processor 30. In particular, only one of Hall-effect sensors 44 will sense the presence of magnet 46 when mirror 38 deflects first laser beam 14 into beam dump 50 (i.e., the closed or blocked position) and only the other of Hall-effect sensors 44 will sense the presence of magnet 46 when mirror 38 permits first laser beam 14 to continue to laser filter 74 (i.e., the open position).

It will be noted that laser filter 74 is preferably mounted adjacent to mirror 38 in order to filter the sidebands of first laser beam 14 (when permitted to pass thereto) so as to allow an optimal wavelength of laser light to pass. At the same time, light (identified by reference numeral 11 in FIG. 3) in wavelengths slightly longer or shorter than the optimal wavelength are preferably reflected into a beam dump 50 located adjacent to optical bench 34 and attached to housing 60 thereof.

More specifically, beam dump 50 preferably includes a layer 51 of light absorbing material having an inverted cone shape and a beam dump housing 52 (made out of aluminum, for example) encasing absorber layer 51. The cone angle and light absorption of layer 51 enable beam dump 50 to contain nearly all of the light entering it from an opening 55 therein oriented toward the inside of optical bench 34. A transparent window 57 made of coated glass preferably covers opening 55 in order to cause a seal within a cavity 65 of beam dump 50, thereby assuring that out-gassing from absorber layer 51 will not deposit on the sensitive internal optics of optical bench 34. Fins 59 are preferably placed on an exterior surface 61 of beam dump housing 52 so as to better dissipate heat therefrom. In this way, it will be appreciated that heat contained within absorber layer 51 is thermally conducted to beam dump housing 52 and to fins 59.

Absorber layer 51 preferably is a single material (e.g., carbon graphite) throughout beam dump 50 so that a light absorptive surface is always present to capture any incoming light beam, even if material on the surface of the conically-shaped depressions 63 is removed. This type of absorber layer 51 is advantageous over an absorber comprising only an absorptive coating on a reflective material, which scatters the laser light instead of capturing it for conversion to heat energy when the coating is removed. Absorber layer 51 preferably contains conically shaped depressions 63 which are oriented so that the wider end is adjacent beam dump housing opening 55 and faces toward the direction from which laser light enters beam dump 50. Conically-shaped depression 63 are designed to direct the extremely small amount of unabsorbed light into, rather than out of, beam dump 50. All internal surfaces of absorber layer 51 are preferably absorptive, rather than reflective, to eliminate backscattering of any light energy that enters absorber layer 51.

FIG. 3 shows that when laser treatment system 10 is operational and first laser beam 14 is used, first laser beam 14 enters optical bench 34 via optical fiber 13 and travels through lens 56 of beam collimator 54. When laser treatment system 10 is operating without a detected error, as shown in FIG. 3, solenoid 36 holds mirror 38 out of the path of first laser beam 14 so that it can proceed past mirror 38 to laser filter 74. As stated herein, laser filter 74 blocks sideband wavelengths close to the wavelengths of optical fluorescent response 94 emitted by the fluorescent slug in optical fiber 20.

The portion of first laser beam 14 blocked by laser filter 74, indicated by reference numeral 11, is preferably reflected into beam dump 50. Beam dump 50 is therefore placed near laser filter 74 to capture at least a portion of laser light reflected thereby. It will be appreciated that laser light energy captured by beam dump 50 is converted to heat and moved away from the optics in optical bench 34 to keep such optics cool. Removing rejected wavelengths of treatment light from optical bench 34 also has the advantage of keeping such light from first laser beam 14 away from fluorescence/blackbody detector 100, whereby measurements using information generated by fluorescence/blackbody detector 100 become more accurate.

If main processor 30 on controller board 28 detects an anomalous condition, it will preferably remove a signal holding solenoid 36 open, thus causing mirror 38 to move into the path of first laser beam 14. This is a fail-safe configuration since solenoid 36 will divert first laser beam 14 to beam dump 50 by default instead of allowing the light therefrom to pass through the rest of optical bench 34. Alternatively, when no signal is required to maintain solenoid 36 in an open position, main processor 30 could send a signal to solenoid 36 causing mirror 38 to move into the path of first laser beam 14. In either case, first laser beam 14 will be reflected into beam dump 50. This position, with solenoid-actuated mirror 38 in the path of first laser beam 14, is shown in FIG. 5.

Figure 5:
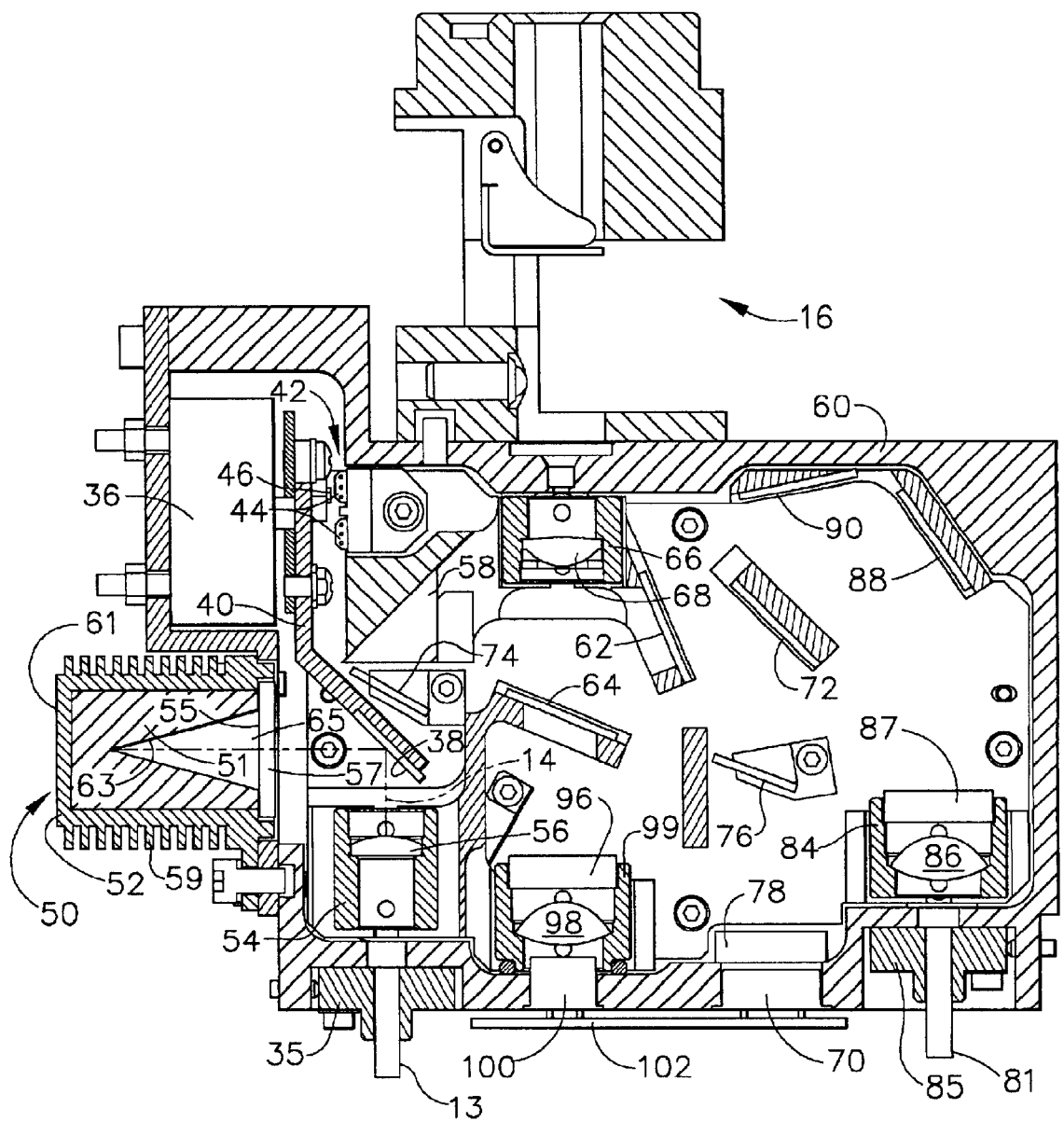
FIG. 5 is a section view of the optical bench as depicted in FIG. 3, where the steering optics therein are in a fail-safe operating position so as to direct the laser beam into a thermally managed beam dump.

FIG. 5 depicts mirror 38 in the path of first laser beam 14. It will be seen that first laser beam 14 is reflected from mirror 38 and passes through window 57 to absorber layer 51 in beam dump 50. Beam dump 50 then absorbs first laser beam 14, converts the light energy thereof to heat energy, and dissipates the heat energy away from the optics in optical bench housing 60. Absorber layer 51, made of a material with a high coefficient of heat transfer and absorptive to light in the waveband of first laser beam 14 (e.g., carbon graphite), absorbs nearly all of the impinging light energy. It will be appreciated, however, that any small portion of reflected light energy travels to another highly absorptive surface within absorber layer 51 because the angle of the conically shaped depression 63 creates an angle of reflection that directs the energy deeper therein. The thermal conductivity of absorber layer 51 then moves thermal energy through beam dump housing 52 to fins 59, where convection occurs to take the heat into the surrounding air and away from optical bench 34. It will be understood that such convection could be natural convection, utilizing the natural air movements caused by temperature differences between fins 59 and ambient air, or forced convection, caused by air moved by an external source such as a fan. Window 57 serves to protect the optical elements of optical bench 34 from debris or particles created by impinging absorber layer 51 with laser light, as well as acts in the capacity of a thermal insulator in helping to keep heat away from optical bench 34.

It will be recognized that equivalent structures may be substituted for the structures illustrated and described herein and that the described embodiment of the invention is not the only structure that may be employed to implement the claimed invention. As one example of an equivalent structure that may be used to implement the present invention, any cooling means may be substituted for fins 59. For example, circulating water could be used in place of the fins 59 to move heat away from beam dump housing 52. However, the heat transfer abilities of absorber layer 51 and beam dump housing 52 allow the use of fins 59 in a medical laser application where expense and close proximity of electronics may proscribe the use of potentially leaky water cooling.

As a further example of an equivalent structure that may be used to implement the present invention, any steering optics to deflect first laser beam 14 into beam dump 50 could be substituted for solenoid-activated mirror 38, such as a prism. Moreover, it will be understood that the steering optics may automatically deflect first laser beam 14 into beam dump 50 until it receives a signal indicating normal operation of laser treatment system 10 from main processor 30. In this scenario, for example, mirror 38 will initially be positioned in the path of first laser beam 14 as seen in FIG. 5. Once laser treatment system 10 is considered to be operating normally, mirror 38 is removed from such path to permit first laser beam 14 to enter optical fiber 20. It will also be appreciated that one or more of the reflecting surfaces already present within optical bench 34 may be rotated, removed or otherwise repositioned so as to cause first laser beam 14 to be deflected into beam dump 50 upon recognition of a specified condition.

While preferred embodiments of the present invention have been shown and described herein, it will be obvious to those skilled in the art that such embodiments are provided by way of example only. Numerous variations, changes, and substitutions will now occur to those skilled in the art without departing from the invention. Accordingly, it is intended that the invention be limited only by the spirit and scope of the appended claims.

What is claimed is:

1. A laser system, comprising:
   (a) a laser for providing laser light;
   (b) a first optical fiber in optical communication with said laser light;
   (c) a second optical fiber;
   (d) an optical bench for directing said laser light from said first optical fiber to said second optical fiber, said optical bench further comprising:
   (1) an optical bench housing;
   (2) a beam dump mounted to said optical bench housing;
   (3) steering optics mounted within said optical bench housing for directing said laser light in an indirect path from said first optical fiber to said second optical fiber; and
   (4) a mechanism for causing said laser light to deviate from said path and be directed into said beam dump upon recognition of a specified condition in said laser system, wherein said laser light is thermally isolated from said steering optics; and
   (e) a processor for controlling said mechanism.

2. The system of claim 1, wherein said mechanism includes at least one optically reflective element to be inserted into said path.

3. The system of claim 2, wherein said optically reflective element is rotatably movable into and out of said path.

4. The system of claim 1, wherein said beam dump comprises a conical beam dump.

5. The system of claim 1, wherein said beam dump comprises a layer of material disposed within a beam dump cavity for absorbing laser light directed into said beam dump.

6. The system of claim 1, wherein said beam dump comprises a window positioned over an opening of the beam dump.

7. The system of claim 1, wherein said mechanism causes at least one optical element of said steering optics to be removed from said path.

8. The system of claim 1, further comprising an optical filter positioned in said laser light path for reflecting light outside a specified wavelength range into said beam dump.

9. The system of claim 1, said beam dump further comprising:
   a beam dump housing having a closed end and an open end, wherein a cavity is formed therein;
   a layer of material disposed within said beam dump cavity for absorbing laserlight directed into said beam dump, said laser absorbing layer being shaped to provide a substantially conical opening therein; and
   a plurality of fins disposed on an exterior surface of said beam dump housing;
   wherein heat contained within said laser absorbing layer is conducted to said beam dump housing and said fins.

10. The system of claim 9, said beam dump further comprising a window positioned over said open end of said beam dump housing to create a seal for said cavity, wherein physical effects of said laser light in said beam dump are isolated from said steering optics.

11. The system of claim 9, wherein said laser absorbing layer is made of a single material.

* * * * *